(12) United States Patent
Chen et al.

(10) Patent No.: US 12,464,682 B2
(45) Date of Patent: Nov. 4, 2025

(54) TERMINAL DEVICE AND TERMINAL DEVICE INSTALLATION METHOD

(71) Applicant: Wistron NeWeb Corporation, Hsinchu (TW)

(72) Inventors: Yuan-Yu Chen, Hsinchu (TW); Ming-Hung Hung, Hsinchu (TW); Po-Chang Chu, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 272 days.

(21) Appl. No.: 18/481,364

(22) Filed: Oct. 5, 2023

(65) Prior Publication Data

US 2024/0121920 A1 Apr. 11, 2024

(30) Foreign Application Priority Data

Oct. 7, 2022 (TW) .................. 111138315

(51) Int. Cl.
*H05K 5/02* (2006.01)
*H05K 5/03* (2006.01)
*H05K 7/20* (2006.01)

(52) U.S. Cl.
CPC ....... *H05K 7/20509* (2013.01); *H05K 5/0217* (2013.01); *H05K 5/03* (2013.01)

(58) Field of Classification Search
CPC .... H05K 5/0217; H05K 5/03; H05K 7/20509; H05K 7/20409
See application file for complete search history.

(56) References Cited

U.S. PATENT DOCUMENTS 7,734,037 B1 * 6/2010 Alvey .................. H04M 19/06
379/413.02

FOREIGN PATENT DOCUMENTS

| TW | 201042161 A | 12/2010 |
| TW | 202126156 A | 7/2021 |

* cited by examiner

*Primary Examiner* — Sherman Ng
(74) *Attorney, Agent, or Firm* — McClure, Qualey & Rodack, LLP (57) ABSTRACT

A terminal device and a terminal device installation method are provided. The terminal device includes a machine body, a detachable cover with two side walls, and at least two coupling mechanisms arranged symmetrically. The machine body includes a front board, a rear board opposite to the front board, and two side boards connected between the front board and the rear board. Each coupling mechanism includes a coupling portion located at one side wall, a front track and a rear track respectively having a front opening and a rear opening opposite to the front opening and both located at one side board. As each coupling portion is coupled to each front track, the cover is assembled with the machine body and covers the front board, and as each coupling portion is coupled with each rear track, the cover is assembled to the machine body and covers the rear board.

15 Claims, 8 Drawing Sheets

TERMINAL DEVICE AND TERMINAL DEVICE INSTALLATION METHOD

CROSS-REFERENCE TO RELATED PATENT APPLICATION

This application claims the benefit of priority to Taiwan Patent Application No. 111138315, filed on Oct. 7, 2022. The entire content of the above identified application is incorporated herein by reference.

BACKGROUND

Technical Field

The present disclosure relates to a device and a method of installing the device, and more particularly, to a terminal device and a terminal device installation method.

Description of Related Art

With the advancement of technology, mobile networks are widely used in everyday life, and as internet of things (IOT) becomes a norm, electronic devices and electrical apparatus like mobile phones and home appliances can all be connected to the internet or network. Therefore, terminal devices like customer premises equipment (CPE) can be installed at a location to transform mobile communication signals like 4G and 5G or wired broadband signals into wired or wireless local network signals for use or connection by apparatus at the location.

Generally speaking, the terminal device includes a housing with electrical components inside, and because the electrical components generate heat during operation, the terminal device is equipped with a cooling board to enhance heat dissipation. Since the temperature of the cooling board could be quite high, a cover is used to cover the cooling board for safety reason so as to prevent users from coming in contact and to improve the overall look of the terminal device.

However, when the terminal device is installed outdoor, the temperature of the cooling board may rise even higher due to heat or high temperature in the outdoor environment, and the shielding of the cover instead affects the heat dissipation of the terminal device.

In view of this, how to improve the structure of a terminal device so it is suitable for installation in different environments is an issue to be resolved by the related industry.

SUMMARY

It is an object of the present disclosure to provide a terminal device that includes a machine body, a cover, and at least two coupling mechanisms. The machine body includes a front board, a rear board opposite to the front board, and two side boards connected between the front board and the rear board. The cover is configured to detachably cover the machine body and includes two side walls. The at least two coupling mechanisms are arranged symmetrically, each of the at least two coupling mechanisms includes a coupling portion, a front track and a rear track, the coupling portion is located at one of the side walls, the front track is located at one of the two side boards and has a front opening, the rear track is located at the one of the two side boards and has a rear opening, and the front opening and the rear opening are in reverse directions. When each of the coupling portions is coupled to each of the front tracks, the cover is assembled with the machine body and covers the front board, and when each of the coupling portions is coupled to each of the rear tracks, the cover is assembled with the machine body and covers the rear board.

It is another object of the present disclosure to provide a terminal device that includes a machine body, a cover, and at least two coupling mechanisms. The machine body includes a front board, a rear board opposite to the front board, and two side boards connected between the front board and the rear board. The cover is configured to detachably cover the machine body and includes two side walls. The at least two coupling mechanisms are arranged symmetrically, each of the coupling mechanisms includes at least one coupling portion and a track, the at least one coupling portion is located at one of the two side boards, the track is located at one of the two side wall and has an opening, and the track is configured to correspond to the at least one coupling portion. The cover is configured to cover the front board by moving toward the front board along a first movement direction so that each of the coupling mechanisms is in a coupled state to assemble the cover with the machine body. The cover is configured to cover the rear board by moving toward the rear board along a second movement direction so that each of the coupling mechanisms is in the coupled state to assemble the cover with the machine body.

It is yet another object of the present disclosure to provide a terminal device installation method that includes a cover detachment step and a cover reattachment step. The cover detachment step includes moving a cover of a terminal device relative to a machine body of the terminal device along a detachment direction before moving the cover away from the machine body so that a coupling mechanism of the terminal device is in a detached state, and the cover is detached from a first side of the machine body. The cover reattachment step includes moving the cover toward a second side of the machine body before moving the cover relative to the machine body along a coupling direction so that the coupling mechanism changes from the detached state to a coupled state, and the cover is assembled with the second side of the machine body.

BRIEF DESCRIPTION OF THE DRAWINGS

The present disclosure can be more fully understood by reading the following detailed description of the embodiment, with reference made to the accompanying drawings as follows.

DETAILED DESCRIPTION

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 1:
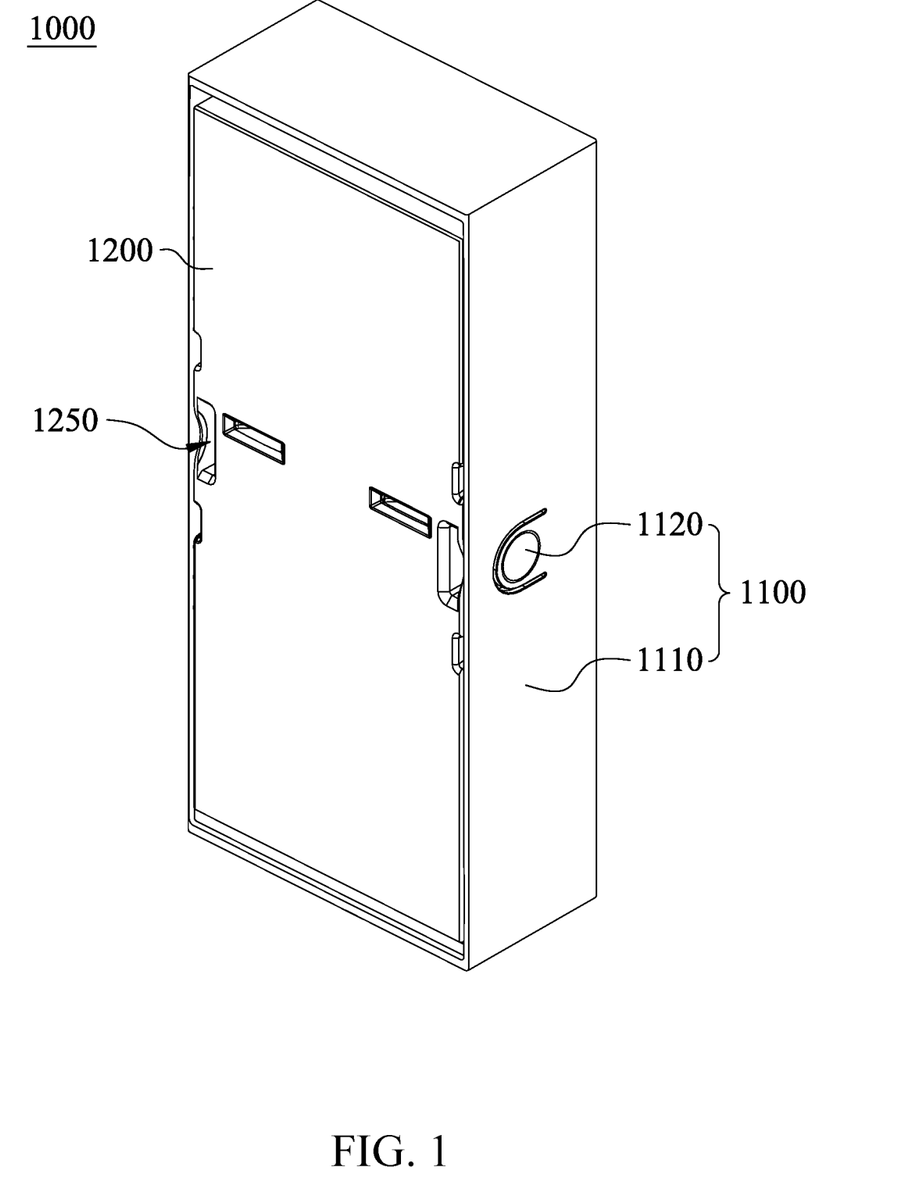
FIG. 1 is one combined schematic perspective view of a terminal device assembled according to one embodiment of the present disclosure.
Figure 2:
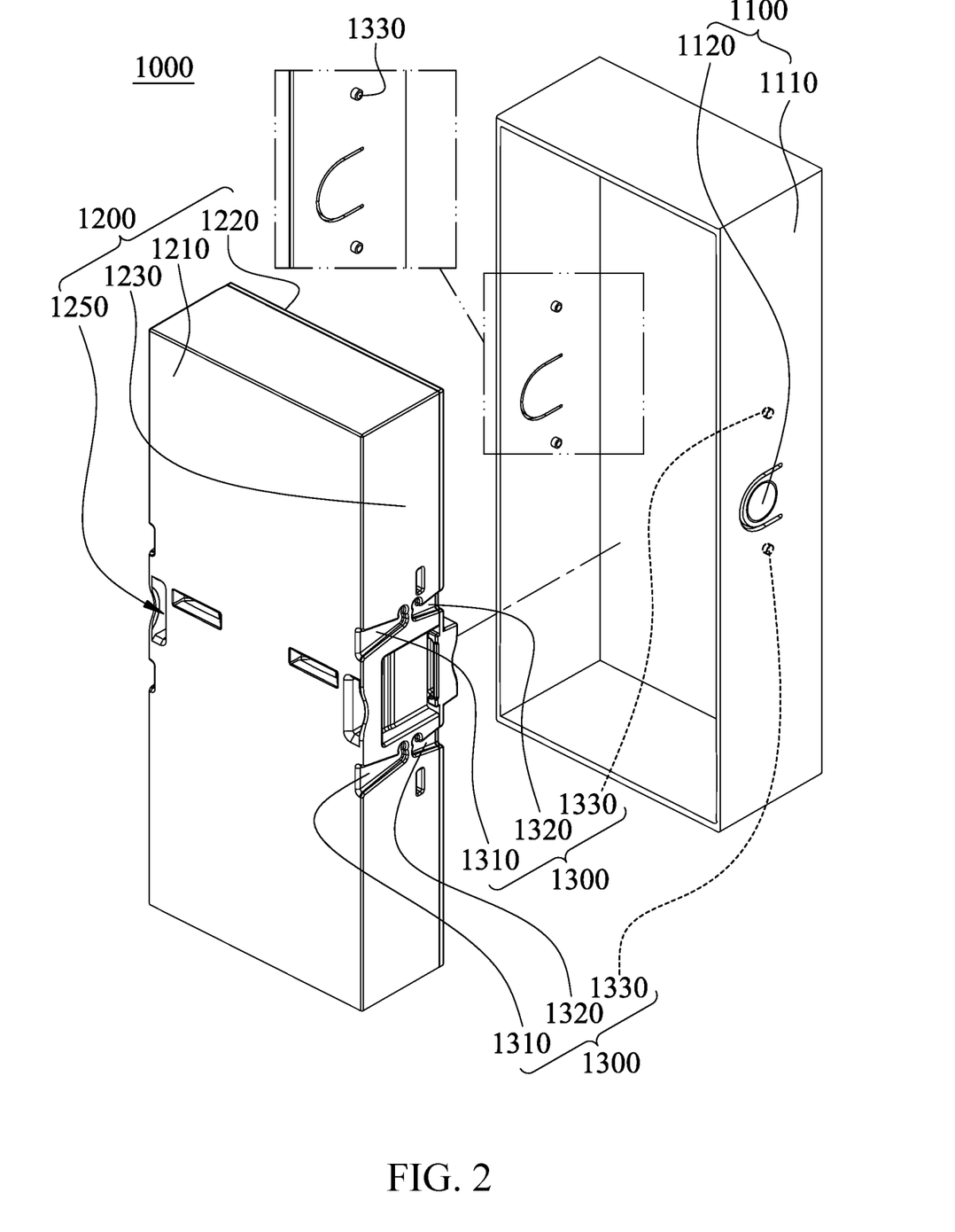
FIG. 2 is a schematic exploded view of the terminal device in FIG. 1.

Referring to FIG. 1 and FIG. 2, FIG. 1 is one combined schematic perspective view of a terminal device 1000 according to one embodiment of the present disclosure, FIG. 2 is a schematic exploded view of the terminal device 1000 in FIG. 1, and the terminal device 1000 includes a machine body 1200, a cover 1100, and at least two coupling mechanisms 1300.

The machine body 1200 includes a front board 1210, a rear board 1220, and two side boards 1230. The rear board 1220 is opposite to the front board 1210, and the two side boards 1230 are connected between the front board 1210 and the rear board 1220. The cover 1100 is configured to detachably cover the machine body 1200 and includes two side walls 1110.

The at least two coupling mechanisms 1300 are arranged symmetrically to each other. Each coupling mechanism 1300 includes a coupling portion 1330, a front track 1310, and a rear track 1320, the coupling portion 1330 is located at one of the two side walls 1110, the front track 1310 is located at one of the two side boards 1230 and has a front opening 1312 (labeled in FIG. 3), the rear track 1320 is located at the same side board 1230 and has a rear opening 1322 (labeled in FIG. 3), and the rear opening 1322 and the front opening 1312 are in reverse directions. When each coupling portion 1330 couples with each front track 1310, the cover 1100 is assembled to the machine body 1200 and covers the front board 1210, and when each coupling portion 1330 couples with each rear track 1320, the cover 1100 is assembled to the machine body 1200 and covers the rear board 1220.

Hence, through the arrangement of the coupling mechanisms 1300, the same cover 1100 is able to cover the front end or the back end of the machine body 1200, so as to adapt to different installation environments with a simple structure change.

In specific, the machine body 1200 is approximately a rectangular case having the front board 1210, the rear board 1220, and the two side boards 1230. The front board 1210, the rear board 1220, and the two side boards 1230 enclose and define an accommodation space for placing circuit boards and electrical components. The cover 1100 has a shape that matches the machine body 1200, so as to cover the machine body 1200, and can selectively cover the front board 1210 or the rear board 1220 of the machine body 1200 depending on the installation environment. The machine body 1200 can further include a heat dissipation board 1240 (labeled in FIG. 5), and the heat dissipation board 1240 is disposed at the rear board 1220 and includes a plurality of cooling fins 1241 (labeled in FIG. 3 and FIG. 5) to improve heat dissipating capability.

In this embodiment, one coupling mechanism 1300 consists of a coupling portion 1330, a front track 1310, and a rear track 1320. When there are two coupling mechanisms 1300, one coupling mechanism 1300 is located at the left side of the machine body 1200 relative to the vertical center line, and the other coupling mechanism 1300 is located at the right side of the machine body 1200 relative to the vertical center line. The two coupling mechanisms 1300 are the same height-wise along the vertical direction, and, in other words, the two coupling mechanisms 1300 are mirror symmetrical with reference to the vertical center line of the machine body 1200. As such, the cover 1100 can cover the front end and the back end of the machine body 1200 through the two left and right symmetrical coupling mechanisms 1300.

As shown in FIG. 2, a number of at least two coupling mechanisms 1300 is four, and a number of the coupling portions 1330 is also four. Two coupling portions 1330 of two of the four coupling mechanisms 1300 are disposed at one side wall 1110 with an interval, and two coupling portions 1330 of the other two of the four coupling mechanisms 1300 are disposed at the other side wall 1110 with an interval. Two front tracks 1310 of two coupling mechanisms 1300 are disposed at one side board 1230 with an interval, and two rear tracks 1320 of two coupling mechanisms 1300 are disposed at the same side board 1230 with an interval. Two front tracks 1310 of the other two coupling mechanisms 1300 are disposed at the other side board 1230 with an interval, and two rear tracks 1320 of the other two coupling mechanisms 1300 are disposed at the same other side board 1230 with an interval. In other words, two coupling portions 1330 on the same side are spaced apart vertically, and so are the two front tracks 1310 on the same side, as well as the two rear tracks 1320 on the same side.

Figure 3:
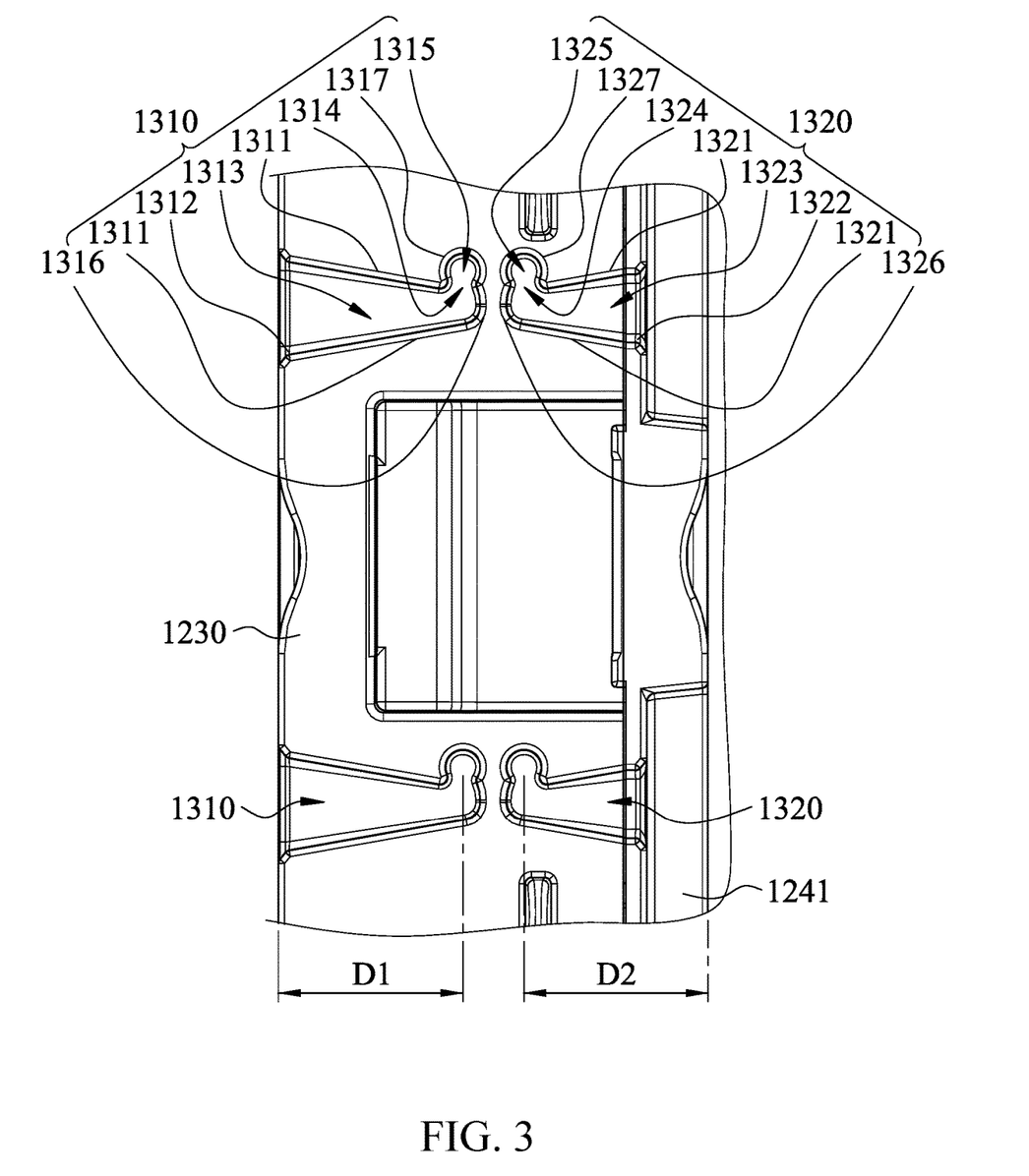
FIG. 3 is a partial schematic perspective side view of a machine body of the terminal device in FIG. 1.

Referring to FIG. 3, which is a partial schematic perspective side view of the machine body 1200 of the terminal device in FIG. 1, each front track 1310 further includes at least one first slanted side 1311, and each rear track 1320 further includes at least one second slanted side 1321. More particularly, a number of at least one first slanted side 1311 of each front track 1310 is two, and the two first slanted sides 1311 face each other and taper toward the rear board 1220. A number of at least one second slanted side 1321 of each rear track 1320 is two, and the two second slanted sides 1321 face each other and taper toward the front board 1210.

As shown in FIG. 3, one front track 1310 and one rear track 1320 are arranged on the same side board 1230 at the same altitude (height) but opposite to each other. Each front track 1310 further includes a first tapering section 1314 and a first restricting section 1315, and the two first slanted sides 1311 of each front track 1310 taper to from a first guiding section 1313. Each first guiding section 1313 is connected to each front opening 1312, and each first tapering section 1314 is connected between each first restricting section 1315 and each first guiding section 1313. Similarly, each rear track 1320 further includes a second tapering section 1324 and a second restricting section 1325, and the two second slanted sides 1321 of each rear track 1320 taper to form a second guiding section 1323. Each second guiding section 1323 is connected to each rear opening 1322, and each second tapering section 1324 is connected between each second restricting section 1325 and each second guiding section 1323.

In specific, the two first slanted sides 1311 approach each other toward the rear board 1220 and form the first guiding section 1313 having a trumpet shape, and the front track 1310 further includes a first bend segment 1316 and a first arc segment 1317. The first bend segment 1316 is integrally connected to the first slanted side 1311 below and extends upward to form the first tapering section 1314 with the first slanted side 1311 above, and one end of the first arc segment 1317 is connected to a distal end of the first slanted side 1311 while the other end is connected to the first bend segment 1316 to form the first restricting section 1315 having a circular notch structure. Similarly, the two second slanted sides 1321 approach each other toward the front board 1210 to form the second guiding section 1323 having a trumpet shape, and the rear track 1320 further includes a second bend segment 1326 and a second arc segment 1327 to form the second tapering section 1324 and the second restricting section 1325. In other embodiments, a number of the first slanted side and a number of the second slanted side are both one, and the first slanted side and the second slanted side are on the upper position where the other side is a horizontal side, but the present disclosure is not limited there to.

In this embodiment, a distance D1 from the outer surface of the front board 1210 to the first restricting section 1315 is equal to a distance D2 from the outer surface of each cooling fin 1241 to the second restricting section 1325. The distance D1 is particularly measured from the outer surface of the front board 1210 to the center of the first restricting section 1315, also being known as the center point of the first arc segment 1317, and the distance D2 is particularly measured from the outer surface of each cooling fin 1241 to the center of the second restricting section 1325, also being known as the center point of the second arc segment 1327. Thus, the cover 1100 can cover the machine body 1200 at the front end or the back end.

Figure 4:
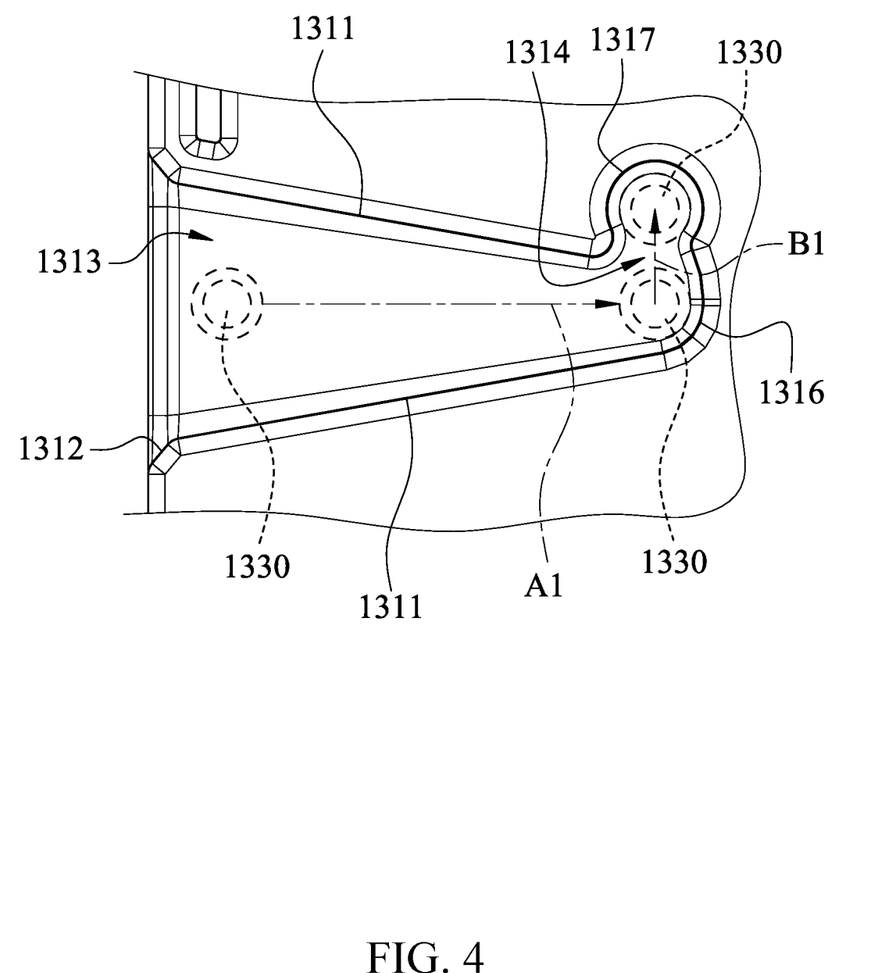
FIG. 4 is a partial schematic side view of the machine body and a coupling portion of the terminal device in FIG. 1.
Figure 5:
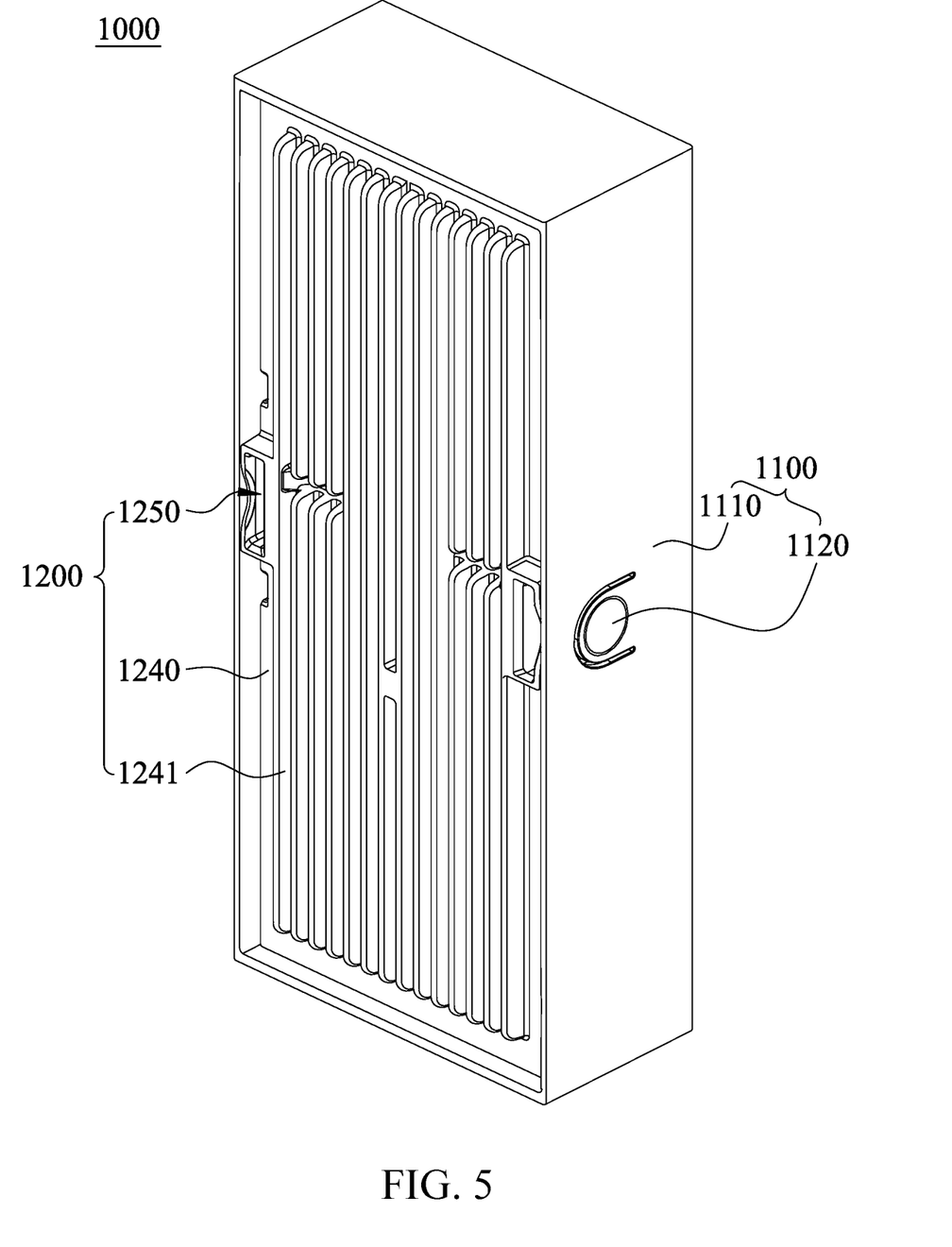
FIG. 5 is another combined schematic perspective view of the terminal device in FIG. 1.

Referring to FIG. 4 and FIG. 5, FIG. 4 is a partial schematic side view of the machine body 1200 and a coupling portion 1330 of the terminal device 1000 in FIG. 1, and FIG. 5 is another combined schematic perspective view of the terminal device 1000 in FIG. 1. To cover the front board 1210, the cover 1100 approaches the front board 1210 along a first movement direction A1 such that each coupling portion 1330 enters each front opening 1312 and then moves along a first coupling direction B1 to couple each coupling portion 1330 with each front track 1310, thereby assembling the cover 1100 to the machine body 1200. Each coupling portion 1330 enters each first guiding section 1313 through each front opening 1312 by moving along the first movement direction A1 and enters the first restricting section 1315 after passing the first tapering section 1314 by moving along the first coupling direction B1 to put the coupling mechanism 1300 in a coupled state. The outer diameter of each coupling portion 1330 is greater than the width of the first tapering section 1314, so that the coupling portion 1330 is prevented from disengaging from the first restricting section 1315 after entering therein. As shown in FIG. 5, the cover 1100 then covers the front end of the machine body 1200, and the front board 1210 is covered while the rear board 1220 and the heat dissipation board 1240 are exposed, which adapts to outdoor environment with high temperature that requires heat dissipation.

To cover the rear board 1220 as shown in FIG. 1, the cover 1100 approaches the rear board 1220 along a second movement direction parallel to the first movement direction A1 but reverse in direction so that each coupling portion 1330 enters each rear opening 1322 and then moves along a second coupling direction, which is the same direction as the first coupling direction B1, so that each coupling portion 1330 couples with each rear track 1320, thereby assembling the cover 1100 and the machine body 1200. In other words, the first coupling direction B1 and the second coupling direction are identical. Each coupling portion 1330 enters each second guiding section 1323 through each rear opening 1322 by moving along the second movement direction and enters the second restricting section 1325 after passing the second tapering section 1324 by moving along the second coupling direction, thereby placing the coupling mechanism 1300 in the coupled state. The outer diameter of each coupling portion 1330 is greater than the width of each second tapering section 1324, so as to prevent the coupling portion 1330 from disengaging from the second restricting section 1325 after the coupling portion 1330 entering the second restricting section 1325.

In this embodiment, each coupling portion 1330 is a hollow column, which is advantageous in deforming to pass through the first tapering section 1314 and the second tapering section 1324 and in returning to original shape to be restricted in the first restricting section 1315 and the second restricting section 1325. In other embodiments, the coupling portion can be a solid column made of elastic material, and the present disclosure is not limited thereby.

The terminal device 1000 is configured to operate with and held by a holder. As shown in FIG. 1 and FIG. 2, the machine body 1200 further includes at least one slot 1250 located at one of the side boards 1230 and configured to work with an arm of the holder. The cover 1100 includes at least one push point 1120 located at one side wall 1110 and corresponding to the arm of the holder, and when the push point 1120 is pressed, the arm disengages from the slot 1250. A number of slot 1250 and a number of push point 1120 can both be two, but the present disclosure is not limited thereby.

In another embodiment, each coupling mechanism includes at least one coupling portion and one track corresponding to the coupling portion. The at least one coupling portion is located at one side board, and the track is located at one side wall and has an opening. The cover covers the front board by approaching or moving toward the front board along a first movement direction to place each coupling mechanism in a coupled state, thereby assembling the cover and the machine body. The cover approaches or moves toward the rear board along a second movement direction to cover the rear board and place each coupling mechanism in the coupled state, so as to assemble the cover and the machine body. In other words, besides the arrangements in FIG. 1 to FIG. 5, the coupling mechanism can have the track located at the side wall of the cover and the coupling portion located at the side board of the machine body. It is to be noted that a number of such track in the coupling mechanism is one, and so it is not necessary to split the track into the front track 1310 and the rear track 1320 as shown in FIG. 1 to FIG. 5.

Based on this structure, a number of coupling portion of each coupling mechanism is one, and the distance from the outer surface of the front board to the coupling portion is equal to the distance from the outer surface of each cooling fin to the coupling portion, so that the cover is able to selectively cover the front end or the back end of the machine body. Moreover, each track further includes two slanted sides that taper toward a lid portion of the cover and have the same structure as the front track 1310 and the rear track 1320 as shown in FIG. 1 to FIG. 5. In addition, the number of coupling portion of each coupling mechanism is two; when the cover is configured to cover the front board, the track couples with one of the two coupling portions, and when the cover is configured to cover the rear board, the track couples with the other one of the two coupling portion, but the present disclosure is not limited thereto.

Figure 6:
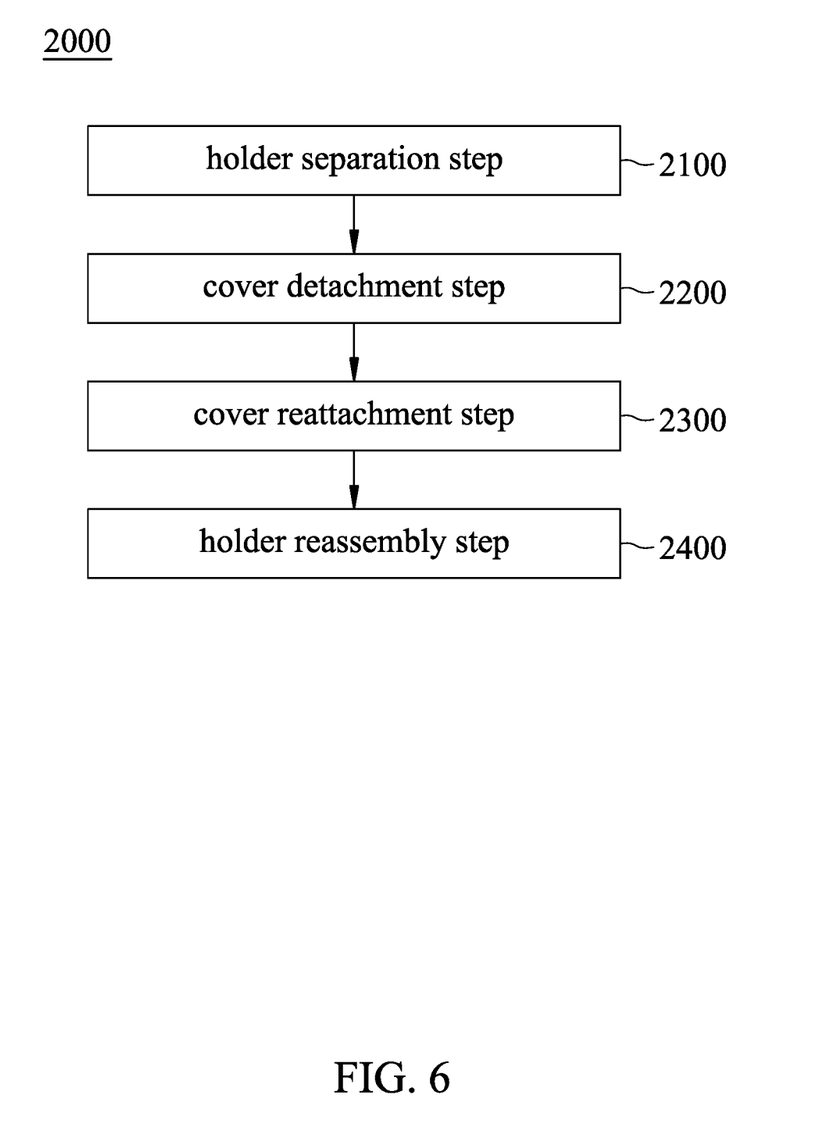
FIG. 6 is a flow chart of a terminal device installation method according to another embodiment of the present disclosure.
Figure 7A:
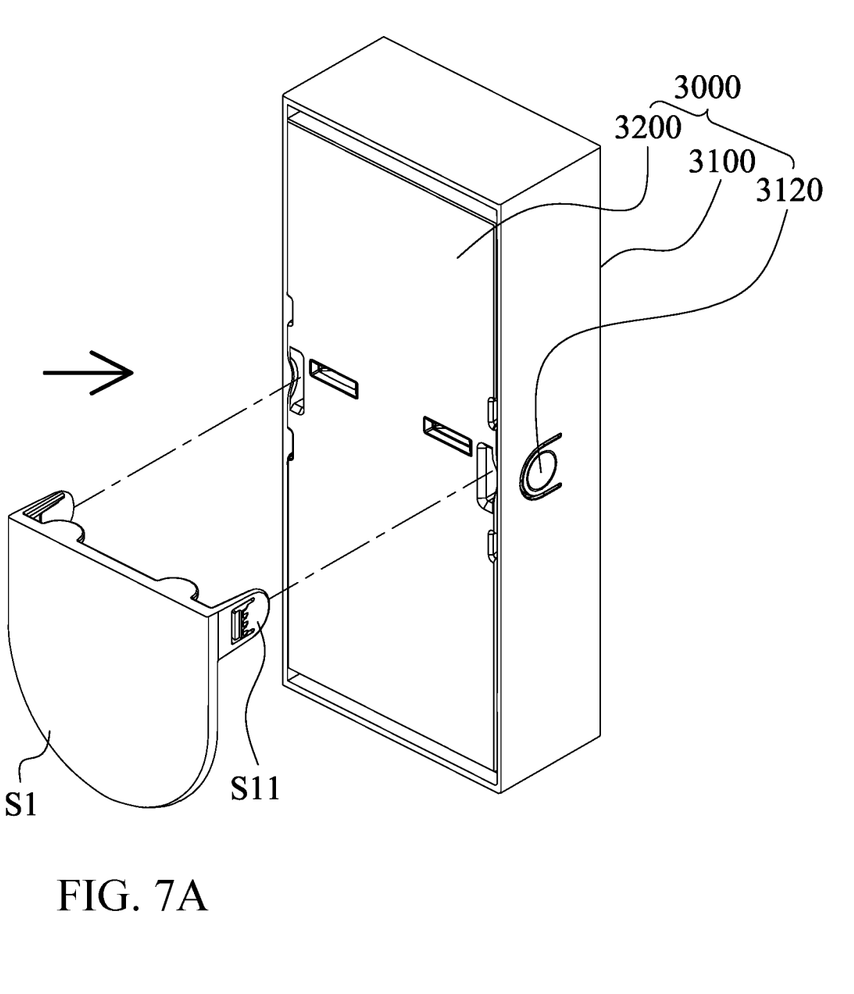
FIG. 7A is a schematic perspective view illustrating an installation step according to the terminal device installation method in FIG. 6.
Figure 7B:
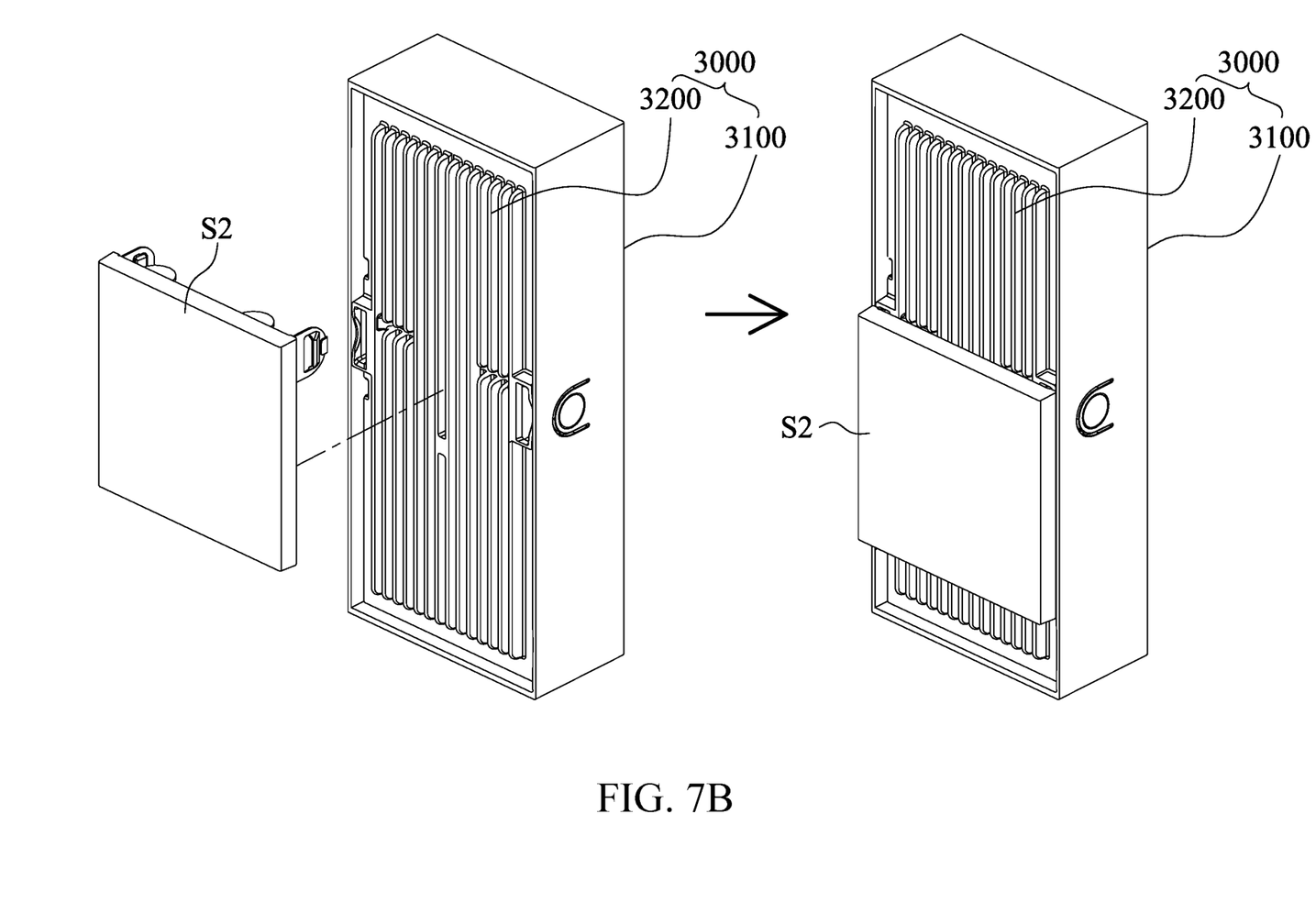
FIG. 7B is a schematic perspective view illustrating another installation step according to the terminal device installation method in FIG. 6.

Referring to FIG. 6, FIG. 7A, and FIG. 7B, FIG. 6 is a flow chart of a terminal device installation method 2000 according to another embodiment of the present disclosure, FIG. 7A is a schematic perspective view illustrating an installation step according to the terminal device installation method 2000 in FIG. 6, FIG. 7B is a schematic perspective view illustrating another installation step according to the terminal device installation method 2000 in FIG. 6, and the terminal device installation method 2000 includes a cover detachment step 2200 and a cover reattachment step 2300.

In the cover detachment step 2200, a cover 3100 of a terminal device 3000 is moved relative to a machine body 3200 of the terminal device 3000 along a detachment direction and then along a direction that is away from the machine body 3200 to place a coupling mechanism of the terminal device 3000 in a detached state, so as to disassemble and detach the cover 3100 from a first side of the machine body 3200.

In the cover reattachment step 2300, the cover 3100 is moved in a direction approaching the machine body 3200 and then moved relative to the machine body 3200 along a coupling direction to place the coupling mechanism from the detached state to a coupled state, so as to assemble the cover 3100 to a second side of the machine body 3200.

The terminal device 3000 used in the terminal device installation method 2000 has the same structure as the terminal device 1000 in FIG. 1 to FIG. 5 and includes the cover 3100, the machine body 3200, and four coupling mechanisms. The structure of the coupling mechanisms is the same as the coupling mechanism 1300 in FIG. 1 to FIG. 5, but the coupling mechanism can also be the one with the track on the side wall and the coupling portion on the side board, the present disclosure is not limited thereby.

The terminal device installation method 2000 further includes a holder separation step 2100 and a holder reassembly step 2400. In the holder separation step 2100, the second side of terminal device 3000 is separated from the holder S1. In the holder reassembly step 2400, the first side of the terminal device 3000 is assembled with the holder S1 or another holder S2. The holder separation step 2100 is performed before the cover reattachment step 2300, and the holder reassembly step 2400 is performed after the cover detachment step 2200. In the holder separation step 2100, at least one push point 3120 on the cover 3100 is pressed to release the coupling between the machine body 3200 and the holder S1. Therefore, in this embodiment, the holder separation step 2100, the cover detachment step 2200, the cover reattachment step 2300, and the holder reassembly step 2400 are performed in sequence. However, in other embodiments, the cover detachment step can be performed first to disassemble the cover from the terminal device before performing the holder separation step to separate the terminal device from the holder, and similarly, the holder reassembly step can be performed first to assemble the terminal device and the holder before performing the cover reattachment step to assemble the cover, as long as the terminal device is separated from the holder before the reattachment of the cover as well as the cover is detached before the different side of the terminal device is assembled to the holder, but the present disclosure is not limited thereto.

As shown in FIG. 6 and FIG. 7A, when the cover 3100 covers the first side (back end) of the machine body 3200 and the second side (front end) of the machine body 3200 is attached to the holder S1, the holder separation step 2100 can be performed by pressing the push point 3120 to disengage the coupling between the machine body 3200 and the arm S11 of the holder S1, so that the terminal device 3000 is separated from the holder S1. Next, the cover detachment step 2200 is performed by moving the cover 3100 along the detachment direction (downward in the drawing) so the coupling portion disengages from the second restricting section of the rear track and by moving the cover 3100 in a direction away from the machine body 3200 so that the coupling portion leaves the rear track, thereby placing the coupling mechanism in the detached state. Hence, the cover 3100 is disassembled from the machine body 3200.

Then, the cover reattachment step 2300 is performed by turning or flipping the machine body 3200 to another side and approaching the cover 3100 near the machine body 3200 until the coupling portion enters the front track and then moving the cover 3100 relative to the machine body 3200 along the coupling direction (upward in the drawing, i.e., the first coupling direction B1 in FIG. 4) so that the coupling portion is restricted by the first restricting section of the front track, thereby placing the coupling mechanism in the coupled state. The cover 3100 at this time covers the second side (front end) of the machine body 3200.

Last, as shown in FIG. 6 and FIG. 7B, the holder reassembly step 2400 is performed to assemble the terminal device 3000 and the holder S2.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A terminal device, comprising:
   a machine body, comprising:
      a front board;
      a rear board, opposite to the front board; and
      two side boards, connected between the front board and the rear board;
   a cover, configured to detachably cover the machine body and comprising two side walls; and at least two coupling mechanisms arranged symmetrically, and each of the at least two coupling mechanisms comprising:
  a coupling portion located at one of the two side walls;
  a front track, located at one of the two side boards and having a front opening; and
  a rear track, located at the one of the two side boards and having a rear opening, wherein the front opening and the rear opening are in reverse directions;
wherein when each of the coupling portions is coupled to each of the front tracks, the cover is assembled with the machine body and covers the front board, and when each of the coupling portions is coupled to each of the rear tracks, the cover is assembled with the machine body and covers the rear board.

2. The terminal device according to claim 1, wherein the cover is configured to cover the front board by moving toward the front board along a first movement direction so that each of the coupling portions enters each of the front openings and is configured to assemble with the machine body by moving along a first coupling direction so that each of the coupling portions and each of the front tracks are coupled; and the cover is configured to cover the rear board by moving toward the rear board along a second movement direction so that each of the coupling portions enters each of the rear openings and is configured to assemble with the machine body by moving along a second coupling direction so each of the coupling portions and each of the rear tracks are coupled.

3. The terminal device according to claim 1, wherein a number of the at least two coupling mechanisms is four and a number of the coupling portions is four, two of the four coupling portions are disposed at one of the two side walls with an interval, and another two of the four coupling portions are disposed at another one of the two side walls with an interval.

4. The terminal device according to claim 1, wherein each of the front tracks further comprises at least one first slanted side, and each of the rear tracks further comprises at least one second slanted side.

5. The terminal device according to claim 4, wherein a number of the at least one first slanted side of each of the front tracks is two, and the two first slanted sides face each other and taper toward the rear board; a number of the at least one second slanted side of each of the rear tracks is two, and the two second slanted sides face each other and taper toward the front board.

6. The terminal device according to claim 5, wherein each of the front tracks further comprises a first tapering section and a first restricting section, the two first slanted sides of each of the front tracks form a first guiding section connected to each of the front openings, each of the first tapering sections is connected between each of the first restricting sections and each of the first guiding sections, and each of the coupling portions is configured to enter each of the first tapering sections from each of the front openings along a first movement direction and to enter each of the first restricting sections after passing through each of the first tapering sections by moving along a first coupling direction; each of the rear tracks further comprises a second tapering section and a second restricting section, the two second slanted sides of each of the rear tracks form a second guiding section connected to each of the rear openings, each of the second tapering sections is connected between each of the second restricting sections and each of the second guiding sections, and each of the coupling portions is configured to enter each of the second guiding sections from each of the rear openings along a second movement direction and to enter each of the second restricting sections after passing through each of the second tapering sections by moving along a second coupling direction.

7. The terminal device according to claim 6, wherein the first coupling direction and the second coupling direction are identical.

8. The terminal device according to claim 6, wherein the coupling portion is a hollow column.

9. The terminal device according to claim 8, wherein an outer diameter of each of the coupling portions is greater than a width of each of the first tapering sections and a width of each of the second tapering sections.

10. The terminal device according to claim 6, wherein the machine body further comprises a heat dissipation board disposed at the rear board and comprising a plurality of cooling fins, and a distance between an outer surface of the front board and the first restricting section is equal to a distance between an outer surface of each of the plurality of cooling fins to the second restricting section.

11. A terminal device, comprising:
  a machine body, comprising:
    a front board;
    a rear board, opposite to the front board; and
    two side boards, connected between the front board and the rear board;
  a cover, configured to detachably cover the machine body and comprising two side walls; and
  at least two coupling mechanisms arranged symmetrically, each of the at least two coupling mechanisms comprising:
    at least one coupling portion, located at one of the two side boards; and
    a track, located at one of the two side walls and having an opening, wherein the track is configured to correspond to the at least one coupling portion;
  wherein the cover is configured to cover the front board by moving toward the front board along a first movement direction so that each of the at least two coupling mechanisms is in a coupled state to assemble the cover with the machine body; the cover is configured to cover the rear board by moving toward the rear board along a second movement direction so that each of the at least two coupling mechanisms is in the coupled state to assemble the cover with the machine body.

12. The terminal device according to claim 11, wherein each of the tracks further comprises two slanted sides facing each other and tapering toward a lid portion of the cover.

13. A terminal device installation method, comprising:
  a cover detachment step comprising moving a cover of a terminal device relative to a machine body of the terminal device along a detachment direction before moving the cover away from the machine body, so that a coupling mechanism of the terminal device is in a detached state, and the cover is detached from a first side of the machine body; and
  a cover reattachment step comprising moving the cover toward a second side of the machine body before moving the cover relative to the machine body along a coupling direction, so that the coupling mechanism changes from the detached state to a coupled state, and the cover is assembled with the second side of the machine body.

14. The terminal device installation method according to claim 13, further comprising:
  a holder separation step comprising separating the second side of the terminal device from a holder; and a holder reassembly step comprising assembling the first side of the terminal device with the holder or another holder;

wherein the holder separation step is performed before the cover reattachment step, and the holder reassembly step is performed after the cover detachment step.

15. The terminal device installation method according to claim 14, wherein the holder separation step further comprises pressing at least one push point on the cover to release a coupling between the machine body and the holder.

* * * * *